(12) United States Patent
Verbunt

(10) Patent No.: US 6,875,260 B2
(45) Date of Patent: Apr. 5, 2005

(54) COPPER ACTIVATOR SOLUTION AND METHOD FOR SEMICONDUCTOR SEED LAYER ENHANCEMENT

(75) Inventor: Han Verbunt, Helmond (NL)

(73) Assignee: Enthone Inc., West Haven, CT (US)

( * ) Notice: Subject to any disclaimer, the term of this patent is extended or adjusted under 35 U.S.C. 154(b) by 16 days.

(21) Appl. No.: 10/315,477

(22) Filed: Dec. 10, 2002

(65) Prior Publication Data

US 2004/0110374 A1 Jun. 10, 2004

(51) Int. Cl.$^7$ .......................... C23C 18/04; B05D 3/10; H01L 21/302; H01L 21/461
(52) U.S. Cl. ...................... 106/1.11; 427/98; 427/304; 427/305; 427/306; 427/437; 427/443.1; 438/689
(58) Field of Search .................. 106/1.11; 427/98, 427/304, 305, 306, 437, 443.1; 438/689

(56) References Cited

U.S. PATENT DOCUMENTS

| | | | | |
|---|---|---|---|---|
| 3,993,491 A | * | 11/1976 | Feldstein | 106/1.11 |
| 4,199,623 A | * | 4/1980 | Nuzzi et al. | 427/305 |
| 4,222,778 A | * | 9/1980 | Nuzzi et al. | 106/1.11 |
| 4,662,944 A | * | 5/1987 | Nuzzi et al. | 106/1.11 |
| 4,701,352 A | * | 10/1987 | DeLuca et al. | 427/98 |
| 5,560,961 A | * | 10/1996 | Adel et al. | 427/304 |
| 5,648,125 A | * | 7/1997 | Cane | 427/534 |
| 5,810,913 A | | 9/1998 | Kanoh et al. | |
| 6,197,181 B1 | | 3/2001 | Chen | |
| 6,316,359 B1 | | 11/2001 | Simpson | |
| 6,338,787 B1 | * | 1/2002 | Obata et al. | 205/687 |

FOREIGN PATENT DOCUMENTS

WO    WO 01/46494 A1    6/2001

OTHER PUBLICATIONS

"Double–sided PCB Fabrication Process"; http://enc.ic.polyu.edu.kh/Training/PCB%20fabrication/double–sided_pcb.htm: pp. 1–6, 8/02.

"Implementing Cleaner Technologies in the PWB Industry: Palladium Methods"; http://www.epa.gov/opptintr/dfe/pubs/pwb/tech_rep/ctech/ct4.html, pp. 1–11, 8/02.

Center for Bio/Molecular Science and Engineering (Code 6900) "Catalyst Development"; http://cbmsews1.nrl.navy.mil/sib/catdev.html; pp. 1–2, 8/02.

Conductor Analysis Technologies, Inc. "Between the Conductors", vol. V, Issue 2; http://biz.swcp.com/cat; pp. 1–3, no date available.

"Profile of the Making Holes Conductive Use Cluster" http://www.epa.gov/dfe/pubs/pwb/ch2/ctsa/ch2.htm; pp. 2–1—2–23, no date available.

* cited by examiner

*Primary Examiner*—Helene Klemanski
(74) *Attorney, Agent, or Firm*—Senniger Powers

(57) ABSTRACT

The present invention is directed to an activator solution and method for activating a copper-seeded surface to facilitate plating of copper onto the copper-seeded surface. The activator solution is prepared by heating a precursor solution to a temperature of at least about 95° C., and maintaining the precursor solution at said temperature for at least about 30 minutes, wherein the precursor solution comprises water, chlorine ions, copper ions, tin (II) ions, and an antioxidant compound which substantially prevents the oxidation of the tin (II) ions to tin (IV) ions.

63 Claims, No Drawings

COPPER ACTIVATOR SOLUTION AND METHOD FOR SEMICONDUCTOR SEED LAYER ENHANCEMENT

BACKGROUND OF THE INVENTION

This invention relates to the deposition of a copper-based activator layer onto substrates and, in particular, to the preparation of copper-based layers on a copper seed layer and/or a barrier layer in preparation for a subsequent electroless and/or electrochemical copper deposition processes. The invention also relatest to deposition copper on an integrated circuit substrate.

An integrated circuit (IC) contains a collection of electrical devices, such as transistors, capacitors, resistors, and diodes, within a dielectric material on a semiconductor. Conductive interconnects connecting discrete devices are referred to as trenches. Additionally, two or more conductive layers, each separated by a dielectric, are typically employed within a given IC to increase its overall performance. Conductive interconnects known as vias are used to connect these distinct conductive layers together. Currently, ICs typically have silicon oxide as the dielectric material and copper as the conductive material.

The demand for manufacturing semiconductor IC devices such as computer chips with high circuit speed, high packing density and low power dissipation requires the downward scaling of feature sizes in ultra-large-scale integration (ULSI) and very-large-scale integration (VLSI) structures. The trend to smaller chip sizes and increased circuit density requires the miniaturization of interconnect features, which severely penalizes the overall performance of the structure because of increasing interconnect resistance and reliability concerns such as electromigration.

Traditionally, such structures had used aluminum and aluminum alloys as the metallization on silicon wafers with silicon dioxide being the dielectric material. In general, openings are formed in the dielectric layer in the shape of vias and trenches after metallization to form the interconnects. Increased miniaturization is reducing the openings to submicron sizes (e.g., 0.5 micron and lower).

To achieve further miniaturization of the device, copper has been introduced to replace aluminum as the metal to form the connection lines and interconnects in the chip. Copper metallization is carried out after forming the interconnects. Copper has a lower resistivity than aluminum and the thickness of a copper line for the same resistance can be thinner than that of an aluminum line. Copper-based interconnects, therefore, represent the future trend in the fabrication of such devices.

The use of copper has introduced a number of requirements into the IC manufacturing process. First, copper has a tendency to diffuse into the semiconductor's junctions, thereby disturbing their electrical characteristics. To combat this occurrence, a barrier layer, such as titanium nitride, tantalum or tantalum nitride, is applied to the dielectric prior to the copper layer's deposition. It is also necessary that the copper be deposited on the barrier layer cost-effectively while ensuring the requisite coverage thickness for carrying signals between the IC's devices. As the architecture of ICs continues to shrink, this requirement proves to be increasingly difficult to satisfy.

One conventional semiconductor manufacturing process is the copper damascene system. Specifically, this system begins by etching the circuit architecture into the substrate's dielectric material. The architecture is comprised of a combination of the aforementioned trenches and vias. Next, a barrier layer is laid over the dielectric to prevent diffusion of the subsequently applied copper layer into the substrate's junctions. Copper is then deposited onto the barrier layer using one of a number of processes, including, for example, chemical vapor deposition (CVD), physical vapor deposition (PVD), or electrochemical deposition. After the copper layer has been deposited, excess copper is removed from the facial plane of the dielectric, leaving copper in only the etched interconnect features of the dielectric. Subsequent layers are produced similarly before assembly into the final semiconductor package.

Electrochemical deposition, the currently preferred method for applying copper, requires deposition of a thin copper seed layer prior to electrochemical deposition so that the copper has an electrically conductive surface on which to deposit. The copper seed layer is typically applied by PVD or CVD, both of which often have coverage problems, especially in interconnects in the device, such that the copper seed layer is non-continuous and has voids and gaps. These voids and gaps in the copper seed layer impair the ability to subsequently deposit a continuous copper layer by electrochemical deposition. The copper seed layer is typically exposed to an activator liquid to fill in the voids and gaps in the seed layer. For example, the seed layer may be exposed to palladium-tin colloidal suspension to deposit palladium-tin particles on the seed layer and fill the voids and gaps in the seed layer. The deposited palladium carries current across the voids and gaps, thereby facilitating subsequent electrochemical deposition of a continuous copper layer.

Although widely used, a palladium-tin colloidal suspension has several drawbacks. For example, the cost of palladium is high, and more important, palladium is an element not yet used in integrate circuit fabrication which introduces uncertainties (e.g., whether it will reduce the conductivity of copper deposited thereon. Thus, a need continues to exist for a less expensive, copper-based activator solution for preparing copper seed layers.

SUMMARY OF THE INVENTION

Among the several objects of this invention, therefore, is the provision of a solution and process for activating a surface for subsequent electroless and electrolytic plating of copper to fill vias and trenches for the manufacture of integrated circuits; and the provision of an activation solution which reduces raw material costs and manufacturing costs; the provision of a method for activating copper seed layers without using a solution or colloidal dispersion that comprises palladium; and the provision of a method for activating copper seed layers using a copper-based activator solution.

Briefly, therefore, the invention is directed to a precursor solution for preparing an activator solution for activating a surface to facilitate electroless plating of copper onto the activated surface. The precursor solution comprises water, chlorine ions, copper ions, tin (II) ions, and an antioxidant compound which substantially prevents the oxidation of the tin (II) ion to tin (IV) ions.

The invention is also directed to a process for preparing an activator solution for activating a surface to facilitate plating of copper onto the activated surface. The process comprises heating the foregoing precursor solution to a temperature of at least about 95° C., and maintaining the precursor solution at said temperature for at least about 30 minutes to form the activator solution.

Additionally, the invention is directed to an activator solution prepared from the foregoing precursor solution by heating the precursor solution to a temperature of at least about 95° C., and maintaining the precursor solution at said temperature for at least about 30 minutes.

The invention is still further directed to a process for preparing a surface for plating copper onto the surface by contacting the surface with an activator solution to deposit an activator layer comprising copper ions. The activator solution comprises water, chlorine ions, copper ions, tin (II) ions, and an antioxidant compound which substantially prevents the oxidation of the tin (II) ions to tin (IV) ions. The deposited activator layer is then contacted with a reducing solution to reduce the valency of the copper ions in the activator layer.

Another aspect of the invention is a process for plating of copper onto a surface. The process comprises contacting the surface with an activator solution to deposit an activator layer comprising copper ions on the surface, wherein the activator solution comprises water, chlorine ions, copper ions, tin (II) ions, and an antioxidant compound which substantially prevents the oxidation of the tin (II) ions to tin (IV) ions. The deposited activator layer is contacted with a reducing solution to reduce the valency of the copper ions in the activator layer. The process then comprises depositing a copper plate layer on the reduced activator layer by a method selected from the group consisting of electroless deposition and electrolytic deposition.

The invention is additionally directed to a process for depositing copper onto a copper-seeded integrated circuit substrate comprising submicron electrical interconnects having copper-seeded interconnect walls. The process comprises contacting the copper-seeded substrate comprising submicron electrical interconnects having copper-seeded interconnect walls with an activator solution to produce an activated copper-seeded substrate comprising submicron electrical interconnect activated copper-seeded walls, wherein the activator solution comprises water, chlorine ions, copper ions, tin (II) ions, and an antioxidant compound which substantially prevents the oxidation of the tin (II) ions to tin (IV) ions. Then the process calls for contacting the activated copper-seeded substrate comprising submicron electrical interconnect activated copper-seeded walls with a reducing solution to reduce the valency of the activated copper-seeded substrate comprising submicron electrical interconnect activated copper-seeded walls. The process also comprises contacting the reduced/activated copper-seeded substrate comprising submicron electrical interconnect reduced/activated copper-seeded walls with an electroless copper plating solution to produce an electroless copper layer on the reduced/activated copper-seeded substrate and on the submicron electrical interconnect reduced/activated copper-seeded walls.

Other objects and features of the invention will be in part apparent, and in part described hereafter.

DETAILED DESCRIPTION OF THE INVENTION

The present invention is directed to an activator solution used to deposit copper onto a surface such as a copper seed layer in preparation for subsequent electroless and/or electrolytic copper deposition processes.

The activator solution of the present invention comprises water, chlorine ions, copper ions, tin (II) ions, and an antioxidant compound which substantially prevents the oxidation of the tin (II) ions to tin (IV) ions. The copper ions may be copper (I) ions, copper (II) ions or a mixture of the two. Without being held to a particular theory, it is presently believed that the tin (II) ions enhance the adsorption of copper ions to the surface and produce a more active surface. In order to maintain the activity of the copper activator solution, the atomic ratio of copper to tin is preferably between about 1:20 and about 1:100. More preferably, the atomic ratio of copper to tin is at least about 1:40, and still more preferably the atomic ratio of copper to tin is between about 1:40 and about 1:80.

The activator solution may also comprise nickel ions. Like the copper ions, the nickel ions to enhance the conductivity of a previously deposited copper seed layer. Also, treating a surface with an activator solution comprising nickel ions tends to result in a surface that is more active than a surface treated with an activator solution without nickel ions. As used herein, the terms "active" and "activity" are defined as the tendency of a solution to deposit a metal, metal ion, or metal-containing compound on a surface or the tendency of a surface to accept a metal, metal ion, or metal-containing compound to be deposited thereon. If nickel is present in the activator solution, the atomic ratio of copper to nickel is preferably between about 10:1 and about 1:1, and more preferably between about 3:1 and about 1:1. The atomic ratio of the combination of copper and nickel to tin preferably corresponds to that for the atomic ratio of copper to tin. In view of the foregoing, the atomic ratio of copper to nickel to tin in one embodiment is between about 1:1:40 and about 1:1:200. In another embodiment, the atomic ratio of copper to nickel to tin is between about 1:1:80 and about 1:1:160. In yet another embodiment, the ratio of copper to nickel to tin is between about 1:1:100 and about 1:1:140.

Tin (II) ions are highly susceptible to oxidation to the +4 valency state, and as the number of tin (II) ions which become oxidized increases, the activity of the solution decreases. To minimize this, the activator solution comprises an antioxidant compound which substantially prevents the oxidation of the tin (II) ions to tin (IV) ions. The antioxidant compound is selected to be more susceptible to oxidation than the tin (II) ions and is essentially sacrificially oxidized, and is also selected in that it does not otherwise interfere with, and is compatible with, the deposition process. For example, the antioxidant compound may be selected from the group consisting of 3-dihydroxybenzene (also referred to resorcinol, 1,3-benzenediol or m-dihydroxybenzene), ascorbic acid, and methanol. The preferred antioxidant compound is 1,3-dihydroxybenzene. The concentration of the antioxidant compound in the colloidal suspension is preferably at least sufficient to substantially prevent the reduction in activity of the activator solution for a duration of at least about one year. This is typically accomplished by including at least about 0.01 M of antioxidant compound in the solution. Preferably, the concentration of the antioxidant compound in the solution is between about 0.01 M to about 1.10 M. In an embodiment of the present invention wherein the activator solution comprises 1,3-dihydroxybenzene as the antioxidant compound, the concentration of the 1,3-dihydroxybenzene in the solution is between about 1 and about 120 g/l. In another embodiment, the concentration of 1,3-dihydroxybenzene is between about 30 to about 70 g/l.

Without being held to a particular theory, it is presently believed that the chlorine ions in the activator solution stabilize the copper (I) ions in the activator solution. In one embodiment, the concentration of chlorine ions is between about 1 and about 12 M. Preferably, the concentration of the chlorine ions is at least about 5 M. In another embodiment, the concentration of chlorine ions is between about 7 and about 12 M. The atomic ratio of copper/nickel to tin to chlorine is, in one embodiment, between about 1:60:40 and about 1:60:150. In yet another embodiment, the atomic ratio of copper/nickel to tin to chlorine is between about 1:60:80 and about 1:60:120.

To achieve the concentration of chlorine and metallic ions in the solution, the starting materials for preparing the activator solution are preferably chlorides such as copper (I) chloride, tin (II) chloride, nickel chloride and hydrochloric acid (hydrogen chloride). For example, the starting solution may comprise between about 0.1 and about 10 g/l of copper (I) chloride, between about 50 and about 1200 g/l of tin (II) chloride (anhydrous), and between about 50 and about 1000 ml/l of a 12 M hydrochloric acid. In one embodiment, the concentration of hydrogen chloride is between about 250 and about 440 g/l. If present, the nickel ions may be supplied with, e.g., between about 1 and about 10 g/l of nickel chloride hexahydrate.

The precursor solution or the activator solution may also comprise a molar ratio of copper (I) chloride to tin (II) chloride to hydrogen chloride that is between about 1:30:50 to about 1:120:100. In another embodiment, the molar ratio of copper (I) chloride to tin (II) chloride to hydrogen chloride is about 1:110:93. In yet another embodiment, the molar ratio of copper (I) chloride to nickel chloride to tin (II) chloride to hydrogen chloride is between about 1:1:80:100 and about 1:1:160:250.

The activator solution is prepared by heating the aqueous solution comprising the chlorine ions, the copper ions, the tin (II) ions, the antioxidant compound, and optionally, the nickel ions to a temperature of at least about 95 C for a duration of at least about 30 minutes. In one embodiment, the aqueous solution is maintained at a temperature between about 5° C. to about 90° C. Preferably, the aqueous solution is maintained at a temperature between about 95 and about 105° C. for a duration between about 30 minutes and about 10 hours, and more preferably, for a duration between about 45 minutes and about 2 hours. Heating the solution results in the solution changing from being transparent and colorless to being transparent and orange which, without being held to a particular theory, is believed to be due to the formation of one or more complexes. Additionally, it has been determined that the activity of the copper activator solution depends, in large part, on the duration of the heat treatment-time periods less than about 30 minutes typically result in poor activity and time periods exceeding about 2 hours on produce a minimal increase in activity.

As mentioned above, the activator solution of the present invention is used to deposit copper on a surface such as a copper seed layer which is deposited on a barrier layer. The barrier layer comprises a metal and/or metal nitride which prevents the diffusion of conductive metals, such as copper, into the silicon wafer. The typical barrier layer comprises tantalum, tantalum nitride, titanium nitride or tungsten nitride and has a thickness between about 100 and 300 Å. The copper seed layer is typically deposited onto the barrier layer using physical or chemical vapor deposition, with physical vapor deposition being preferred because of its superior adhesion. The typical thickness of the copper seed layer is between about 50 and about 500 Å and is preferably between about 100 and about 250 Å thick. A copper seed layer of this thickness often has gaps or discontinuous regions within the layer, which compromises the subsequent electrochemical deposition of copper.

In accordance with the present invention, an activator layer comprising copper and tin, and optionally nickel, is formed on a copper seed layer using the above-described activator solution according to conventional techniques. In a particular embodiment of the present invention, prior to contacting the copper seed layer with the activator solution, the seed layer is contacted with an alkaline cleaner comprising a caustic compound and a wetting agent for a duration of about 2 minutes to ensure good wetting of the solutions used in the subsequent steps. The cleaned surface is rinsed with water and then contacted with the activator solution for a duration sufficient to deposit an activator layer of a desired thickness (e.g., a thickness sufficient to fill voids and openings in the copper seed layer). A surface contacted with the activator solution for a duration of between about 5 seconds and about 10 minutes will typically have an activator layer with an average thickness of between about 1 and about 100 nm. Typically, the surface is contacted with the activator solution for a duration of between about 1 and about 5 minutes to deposit an activator layer having an average thickness of between about 1 and about 100 nm. The deposited activator layer is then rinsed with water. In a preferred embodiment of the present invention the activator solution is used to activate a copper-seeded integrated circuit substrate, including copper-seeded interconnect walls, to produce an activated copper-seeded substrate comprising submicron electrical interconnect activated copper-seeded walls.

To prepare the activator layer for subsequent electroless and/or electrolytic deposition of copper, the activator layer is contacted with a reduction solution to reduce the deposited copper and optional nickel ions to a zero valency state. Exemplary reduction solutions comprise a reducing agent selected from the group consisting of polyamine boranes (e.g., dimethylamine borane), hypophosphite, borohydride, and hydrazine, with dimethylamine borane being preferred. The concentration of the reducing agent in the reduction solution is preferably sufficient to completely reduce all the metallic ions in the activator layer. For example, the preferable concentration of dimethylamine borane in the reduction solution is between about 1 g/l and about 100 g/l, and more preferably, between about 30 g/l and about 90 g/l. In one embodiment, the concentration of dimethylamine borane in the reducing solution is about 80 g/l and the temperature of the solution is maintained at about 65° C., and the substrate is contacted with the reducing solution for about one minute. After being reduced, the deposited activator layer tends to improve the electrical conductivity of the previously deposited electrical conductor (i.e., the copper seed layer), which may have discontinuities such as voids or gaps.

After the activator layer has been reduced, the surface is preferably rinsed with water and may then be subjected to an electroless plating operation and/or an electrolytic plating operation to deposit a conductive metal layer (preferably copper) onto the activated copper seed layer. Specifically, a substrate will typically be subjected to both electroless and electrolytic deposition, however, if the discontinuities in the copper seed layer were small, it may be possible to omit the electroless copper deposition step.

A portion of a copper conductive metal layer may be deposited using any appropriate electroless copper plating solution to produce an electroless copper layer on the activated/reduced copper-seeded substrate and on the submicron electrical interconnect activated/reduced copper-seeded walls. Preferably, the electroless plating solution is free of formaldehyde, sodium, and potassium because of formaldehyde's toxicity and because mobile ions such as alkali metal ions which may be critical contaminants for CMOS devices. One such electroless copper plating solution comprises about 10.0 g/l of copper sulphate 5 aq, about 14.4 g/l ethylenediaminetetraaceitic acid (EDTA), about 172 g/l tetramethylammonium hydroxide (TMAH), about 7.4 g/l gloxylic acid, about 5.0 mg/l 2,2-bipyridyl, and about 0.10 mg/l 2-mercaptiothiazoline (2-MTA). Typically, the activated/reduced substrate is immersed in the foregoing electroless copper bath (maintained at about 65° C.) for at least about one minute, rinsed in cold water, and hot air dried.

The remaining portion of the copper conductive metal layer may be deposited using a conventional electrolytic copper plating solution which typically comprises between about 5 and about 200 g/l of sulfuric acid, between about 5 and about 50 g/l of copper, and between about 10 and about 100 g/l of chlorine ions. Typical copper plating solutions also comprise organic additives such as levelers, brighteners, wetting agents, and ductility enhancers to produce desired film characteristics and to provide better filling of the recessed structures on the wafer surface. During an electrolytic deposition process the vias and trenches are substantially filled. After electrolytic deposition, the barrier layer and copper layers disposed above the vias and trenches are removed using any suitable process thereby leaving only the vias and trenches with the copper metallization. Typically, the thickness of the copper plate (electroless and/or electrolytic deposition) is between about 10 and about 1000 nm.

EXAMPLE

An activator solution in accordance with the present invention was prepared by first mixing about 400 ml of water, about 375 ml concentrated hydrochloric acid, about 50 g of resorcinol and about 500 g tin (II) chloride. A second solution containing about 100 ml of water, about 10 ml of concentrated hydrochloric acid and about 4.5 g of copper (I) chloride was prepared. The solutions were mixed together and the volume adjusted to about 1000 ml. The solution was heated to about 100° C. and kept at this temperature for about one hour. The activator solution was then allowed to cool to room temperature.

A silicon wafer having a 25 nm thick tantalum barrier layer and a copper seed layer was immersed in an alkaline cleaner, rinsed with water, and then immersed in the activator solution for about 1 minute. The wafer was removed from the activator solution, rinsed with water, and contacted with a 32 g/l dimethylamine borane reduction solution (at about 75° C.) for about 2 minutes and again rinsed with water. The wafer was then immersed in the above-described electroless copper bath for about 2 minutes, rinsed with water, and dried with hot air. The copper plating covered the entire wafer and the adhesion of the plate was good.

It is to be understood that the above description is intended to be illustrative and not restrictive. Many embodiments will be apparent to those of skill in the art upon reading the above description. The scope of the invention should therefore be determined not with reference to the above description alone, but should also be determined with reference to the claims and the full scope of equivalents to which such claims are entitled.

What is claimed is:

1. A precursor solution for preparing an activator solution for activating a surface to facilitate electroless plating of copper onto the activated surface, the precursor solution comprising:

water;

chlorine ions;

copper, ions tin (II) ions, and nickel ions with an atomic ratio of copper ions to nickel ions between about 10:1 and about 1:1 for formation of an activator layer comprising copper, tin, and nickel; and an antioxidant compound which substantially prevents the oxidation of the tin (II) ion to tin (IV) ions.

2. The precursor solution as set forth in claim 1 wherein the copper ions are selected from the group consisting of copper (I) ions and copper (II) ions.

3. The precursor solution as set forth in claim 1 wherein a source compound for the copper ions is selected from the group consisting of copper (I) chloride and copper (II) chloride, a source compound for the tin (II) ions is tin (II) chloride, and a source compound for the chlorine ions is hydrogen chloride.

4. The precursor solution as set forth in claim 3 wherein the concentration of copper (I) chloride is between about 1 and about 10 g/l.

5. The precursor solution as set forth in claim 3 wherein the concentration of tin (II) chloride is between about 50 and about 1200 g/l.

6. The precursor solution as set forth in claim 3 wherein the concentration of hydrogen chloride is between about 250 and about 440 g/l.

7. The precursor solution as set forth in claim 3 wherein the concentration of the antioxidant compound is between about 1 and about 120 g/l.

8. The precursor solution as set forth in claim 1 wherein the antioxidant compound is selected from the group consisting of 1,3-dihydroxybenzene, ascorbic acid, and methanol.

9. The precursor solution as set forth in claim 8 wherein the concentration of 1,3-dihydroxybenzene is between about 5 and about 120 g/l.

10. The precursor solution as set forth in claim 8 wherein the molar ratio of copper (I) chloride to tin (II) chloride to hydrogen chloride is between about 1:30:50 and about 1:120:100.

11. The precursor solution as set forth in claim 8 wherein the molar ratio of copper (I) chloride to tin (II) chloride to hydrogen chloride is about 1:110:93.

12. The precursor solution as set forth in claim 3 comprising nickel (II) chloride as a source compound for the Ni ions.

13. The precursor solution as set forth in claim 12 wherein the concentration of nickel (II) chloride is between about 0.1 and about 10 g/l.

14. The precursor solution as set forth in claim 12 wherein the molar ratio of copper (I) chloride to nickel chloride to tin (II) chloride to hydrogen chloride is between about 1:1:80:100 and about 1:1:160:250.

15. A process for preparing an activator solution for activating a surface to facilitate plating of copper onto the activated surface, the process comprising:

heating a precursor solution to a temperature of at least about 95° C., and maintaining the precursor solution at said temperature for at least about 30 minutes to form the activator solution;

wherein the precursor solution comprises water, chlorine ions, copper ions, tin (II) ions, and an antioxidant compound which substantially prevents the oxidation of the tin (II) ions to tin (IV) ions.

16. The process as set forth in claim 15 wherein the precursor solution is maintained at a temperature between about 95° C. and about 105° C. for between about 30 minutes and about 10 hours.

17. The process as set forth in claim 15 wherein a source compound of the copper ions is selected from the group consisting of copper (I) chloride and copper (II) chloride, a source compound of the tin (II) ions is tin (II) chloride, and a source compound of the chlorine ions is hydrogen chloride.

18. The process as set forth in claim 17 wherein the concentration of copper (I) chloride in the precursor solution is between about 1 and about 10 g/l.

19. The process as set forth in claim 17 wherein the concentration of tin (II) chloride in the precursor solution is between about 50 and about 1200 g/l.

20. The process as set forth in claim 17 wherein the concentration of hydrogen chloride in the precursor solution is about 250 and about 440 g/l.

21. The process as set forth in claim 17 wherein the concentration of the antioxidant compound in the precursor solution is about 1 and about 120 g/l.

22. The process as set forth in claim 17 wherein the molar ratio of copper (I) chloride to tin (II) chloride to hydrogen chloride in the precursor solution is between about 1:30:50 and about 1:120:100.

23. The process as set forth in claim 17 wherein the molar ratio of copper (I) chloride to tin (II) chloride to hydrogen chloride in the precursor solution is about 1:110:93.

24. The process as set forth in claim 15 wherein the antioxidant compound is selected from the group consisting of 1,3-dihydroxybenzene, ascorbic acid, and methanol.

25. The process as set forth in claim 24 wherein the concentration of 1,3-dihydroxybenzene in the precursor solution is about 5 and about 120 g/l.

26. The process as set forth in claim 17 wherein the precursor solution further comprises nickel ions.

27. The process as set forth in claim 26 wherein a source compound for the nickel ions is nickel (II) chloride.

28. The process as set forth in claim 27 wherein the concentration of nickel (II) chloride in the precursor solution is between about 0.1 and about 10 g/l.

29. The process as set forth in claim 27 wherein the molar ratio of copper (I) chloride to nickel (II) chloride to tin (II) chloride to hydrogen chloride in the solution is between about 1:1:80:100 and about 1:1:160:250.

30. An activator solution for activating a surface to facilitate plating of copper onto the activated surface, the activator solution being prepared by heating a precursor solution to a temperature of at least about 95° C., and maintaining the precursor solution at said temperature for at least about 30 minutes, wherein the precursor solution comprises water, chlorine ions, copper ions, tin (II) ions, and an antioxidant compound which substantially prevents the oxidation of the tin (II) ions to tin (IV) ions.

31. The activator solution as set forth in claim 30 wherein the precursor solution is maintained at a temperature between about 95° C. and about 105° C. for between about 30 minutes and about 10 hours.

32. The activator solution as set forth in claim 30 wherein a source compound of the copper ions is selected from the group consisting of copper (I) chloride and copper (II) chloride, a source compound of the tin (II) ions is tin (II) chloride, and a source compound of the chlorine ions is hydrogen chloride.

33. The activator solution as set forth in claim 32 wherein the concentration of copper (I) chloride in the precursor solution is between about 1 and about 10 g/l.

34. The activator, solution as set forth in claim 32 wherein the concentration of tin (II) chloride in the precursor solution is between about 50 and about 1200 g/l.

35. The activator solution as set forth in claim 32 wherein the concentration of hydrogen chloride in the precursor solution is between about 250 and about 440 g/l.

36. The activator solution as set forth in claim 32 wherein the concentration of the antioxidant compound in the precursor solution is between about 1 and about 120 g/l.

37. The activator solution as set forth in claim 32 wherein the molar ratio of copper (I) chloride to tin (II) chloride to hydrogen chloride in the precursor solution is between about 1:30:50 and about 1:120:100.

38. The activator solution as set forth in claim 32 wherein the molar ratio of copper (I) chloride to tin (II) chloride to hydrogen chloride in the precursor solution is about 1:110:93.

39. The activator solution as set forth in claim 30 wherein the antioxidant compound is selected from the group consisting of 1,3-dihydroxybenzene, ascorbic acid, and methanol.

40. The activator solution as set forth in claim 39 wherein the concentration of 1,3-dihydroxybenzene in the precursor solution is between about 5 and about 120 g/l.

41. The activator solution as set forth in claim 30 wherein the precursor solution further comprises nickel ions.

42. The activator solution as set forth in claim 41 wherein a source compound for the nickel ions is nickel (II) chloride.

43. The activator solution as set forth in claim 41 wherein the concentration of nickel (II) chloride in the precursor solution is between about 0.1 and about 10 g/l.

44. The activator solution as set forth in claim 41 wherein the molar ratio of copper (I) chloride to nickel (II) chloride to tin (II) chloride to hydrogen chloride in the solution is between about 1:1:80:100 and about 1:1:160:250.

45. A process for preparing a copper-seeded surface of an integrated circuit substrate comprising electrical interconnects having copper-seeded interconnect walls for plating copper onto the surface, the process comprising:
  contacting the copper-seeded surface of the integrated circuit substrate comprising electrical interconnects having copper-seeded interconnect walls with an activator solution to deposit an activator layer comprising copper ions on the copper-seeded surface, wherein the activator solution comprises water, chlorine ions, copper ions, tin (II) ions, and an antioxidant compound which substantially prevents the oxidation of the tin (II) ions to tin (IV) ions; and
  contacting the deposited activator layer with a reducing solution to reduce the valency of the copper ions in the activator layer so that the activator layer improves the electrical conductivity of the copper-seeded surface.

46. The process as set forth in claim 45 wherein the copper-seeded surface is made from a material selected from the group consisting of silicon, tantalum, tantalum nitride, and titanium nitride.

47. The process as set forth in claim 45 wherein the copper-seeded surface is contacted with the activator solution for a duration between about 5 seconds and about 10 minutes.

48. The process as set forth in claim 45 comprising maintaining the activator solution at a temperature between about 5° C. to about 90° C.

49. The process as set forth in claim 45 wherein the activator solution comprises between about 1 and about 10 g/l of copper (I) chloride, between about 50 and about 1200 g/l of tin (II) chloride, between about 250 and about 440 g/l of hydrogen chloride, between about 1 and about 120 g/l of 1,3dihydroxybenzene as the antioxidant compound, and the molar ratio of copper (I) chloride to tin (II) chloride to hydrogen chloride is between about 1:30:50 and about 1:120:100.

50. The process as set forth in claim 49 wherein the activator solution further comprises nickel ions from nickel (II) chloride at a concentration of between about 0.1 and about 10 g/l, and the molar ratio of copper (I) chloride to nickel (II) chloride to tin (II) chloride to hydrogen chloride in the solution is between about 1:1:80:100 and about 1:1:160:250.

51. A process for plating of copper onto a copper-seeded surface of an integrated circuit substrate comprising electrical interconnects having copper-seeded interconnect walls, the process comprising:

contacting the copper-seeded surface of the integrated circuit substrate comprising electrical interconnects having copper-seeded interconnect walls with an activator solution to deposit an activator layer comprising copper ions on the surface, wherein the activator solution comprises water, chlorine ions, copper ions, tin (II) ions, and an antioxidant compound which substantially prevents the oxidation of the tin (II) ions to tin (IV) ions;

contacting the deposited activator layer with a reducing solution to reduce the valency of the copper ions in the activator layer so that the activator layer improves the electrical conductivity of the copper-seeded surface; and depositing a copper plate layer on the reduced activator layer by a method selected from the group consisting of electroless deposition and electrolytic deposition.

52. The process as set forth in claim 51 wherein the copper-seeded surface is made from a material selected from the group consisting of silicon, tantalum, tantalum nitride, and titanium nitride.

53. The process as set forth in claim 51 wherein the copper-seeded surface is contacted with the activator solution for a duration between about 5 seconds and about 10 minutes.

54. The process as set forth in claim 51 wherein the activator layer has a thickness between about 1 and about 100 nm.

55. The process as set forth in claim 51 wherein the copper plate layer has a thickness between about 10 and about 1000 nm.

56. The process as set forth in claim 51 wherein the activator solution comprises between about 1 and about 10 g/l of copper (I) chloride, between about 50 and about 1200 g/l of tin (II) chloride, between about 250 and about 440 g/l of hydrogen chloride, between about 1 and about 120 g/l of 1,3-dihydroxybenzene as the antioxidant compound, and the molar ratio of copper (I) chloride to tin (II) chloride to hydrogen chloride is between about 1:30:50 and about 1:120:100.

57. The process as set forth in claim 56 wherein the activator solution further comprises nickel ions from nickel (II) chloride at a concentration of between about 0.1 and about 10 g/l, and the molar ratio of copper (I) chloride to nickel (II) chloride to tin (II) chloride to hydrogen chloride in the solution is between about 1:1:80:100 and about 1:1:160:250.

58. A process for depositing copper onto a copper-seeded integrated circuit substrate comprising submicron electrical interconnects having copper-seeded interconnect walls, the process comprising:

contacting the copper-seeded substrate comprising submicron electrical interconnects having copper-seeded interconnect walls with an activator solution to produce an activated copper-seeded substrate comprising submicron electrical interconnect activated copper-seeded walls, wherein the activator solution comprises water, chlorine ions, copper ions, tin (II) ions, and an antioxidant compound which substantially prevents the oxidation of the tin (II) ions to tin (IV) ions;

contacting the activated copper-seeded substrate comprising submicron electrical interconnect activated copper-seeded walls with a reducing solution to reduce the valency of the activated copper-seeded substrate comprising submicron electrical interconnect activated copper-seeded walls; and contacting the reduced/activated copper-seeded substrate comprising submicron electrical interconnect reduced/activated copper-seeded walls with an electroless copper plating solution to produce an electroless copper layer on the reduced/activated copper-seeded substrate and on the submicron electrical interconnect reduced/activated copper-seeded walls.

59. The process of claim 58 further comprising electrolytically depositing copper onto the electroless copper layer to electrolytically fill the interconnects with copper.

60. The process of claim 58 wherein the electroless plating solution is free of formaldehyde, sodium, and potassium.

61. The process as set forth in claim 58 wherein the copper-seeded substrate is contacted with the activator solution for a duration between about 5 seconds and about 10 minutes.

62. The process as set forth in claim 58 wherein the activator solution comprises between about 1 and about 10 g/l of copper (I) chloride, between about 50 and about 1200 g/l of tin (II) chloride, between about 250 and about 440 g/l of hydrogen chloride, between about 1 and about 120 g/l of 1,3-dihydroxybenzene as the antioxidant compound, and the molar ratio of copper (I) chloride to tin (II) chloride to hydrogen chloride is between about 1:30:50 and about 1:120:100.

63. The process as set forth in claim 62 wherein the activator solution further comprises nickel ions from nickel (II) chloride at a concentration of between about 0.1 and about 10 g/l, and the molar ratio of copper (I) chloride to nickel (II) chloride to tin (II) chloride to hydrogen chloride in the solution is between about 1:1:80:100 and about 1:1:160:250.

* * * * *